(12) United States Patent
Simmonds (10) Patent No.: US 10,128,834 B2
(45) Date of Patent: Nov. 13, 2018

(54) BIDIRECTIONAL INTEGRATED CMOS SWITCH

(71) Applicant: Telephonics Corporation, Farmingdale, NY (US)

(72) Inventor: Harold Simmonds, Stewartsville, NJ (US)

(73) Assignee: Telephonics Corporation, Farmingdale, NY (US)

( * ) Notice: Subject to any disclaimer, the term of this patent is extended or adjusted under 35 U.S.C. 154(b) by 0 days.

(21) Appl. No.: 15/918,156

(22) Filed: Mar. 12, 2018

(65) Prior Publication Data

US 2018/0212600 A1   Jul. 26, 2018

Related U.S. Application Data

(63) Continuation of application No. 14/538,062, filed on Nov. 11, 2014, now Pat. No. 9,948,292.

(60) Provisional application No. 61/902,910, filed on Nov. 12, 2013.

(51) Int. Cl.
*H03K 17/687*   (2006.01)
*H03K 17/082*   (2006.01)
*H02M 5/293*   (2006.01)
*H02M 7/219*   (2006.01)

(52) U.S. Cl.
CPC .......... *H03K 17/687* (2013.01); *H02M 5/293* (2013.01); *H02M 7/219* (2013.01); *H03K 17/0822* (2013.01); *H03K 2217/0054* (2013.01)

(58) Field of Classification Search
CPC ............ H03K 17/687; H03K 17/0822; H03K 2217/0054; H02M 7/219; H02M 5/293
See application file for complete search history.

(56) References Cited

U.S. PATENT DOCUMENTS

| | | | |
|---|---|---|---|
| 6,269,012 B1 * | 7/2001 | Kusakabe | H02M 7/217 323/239 |
| 7,760,007 B2 | 7/2010 | Holzman | |
| 8,461,905 B2 | 6/2013 | Krauss | |
| 2013/0194158 A1 | 8/2013 | Chen | |

OTHER PUBLICATIONS

MAX14777—Quad-Beyond-the-Rails—15V to +35V Analog Switch, Maxim Integrated Products, Inc., http://datasheets.maximintegrated.com/en/ds/MAX14777.pdf.

* cited by examiner

*Primary Examiner* — Jung Kim
(74) *Attorney, Agent, or Firm* — Thomas A. O'Rourke; Bodner & O'Rourke, LLP (57) ABSTRACT

A bidirectional integrated CMOS switch is provided which is capable of switching voltages beyond the range of the supply and ground potentials. The switch is composed of NMOS and PMOS transistors as the switch conductor path, a diode bridge, and control circuitry to turn the switch on and off by means of low voltage logic, regardless of the voltages on the switch terminals. The device and method of the invention enables the switching of high voltage loads operating at arbitrary or floating voltages relative to the low voltage power supply and ground, and provides on/off control of the switch with ordinary low voltage logic levels. The invention provides bidirectional switching without conducting through the parasitic body diodes of the CMOS devices.

3 Claims, 11 Drawing Sheets

Example 2: Connecting a load to a floating high voltage source of arbitrary polarity (Alternative arrangement)

FIGURE 4

Example 3: Connecting a load to a non-floating high voltage source of arbitrary polarity with an arbitrary offset voltage

FIGURE 5

Example 4: Connecting a load to a non-floating high voltage source of arbitrary polarity with an arbitrary offset voltage (Alternative arrangement)

FIGURE 6

Example 5: Connecting a load between two arbitrary voltage sources

Example of an embodiment in which M0 and M1 are implemented as discret components separate from the rest of the circuitry

BIDIRECTIONAL INTEGRATED CMOS SWITCH

The application is a continuation of U.S. application Ser. No. 14/538,062, filed on Nov. 11, 2014, which claims priority on U.S. Provisional Patent Application Ser. No. 61/902,910, filed on Nov. 12, 2013, all disclosures of which are incorporated herein by reference.

BACKGROUND OF THE INVENTION

CMOS is the dominant technology in almost all VLSI design. CMOS circuits use a combination of p-channel (PMOS) and n-channel (NMOS) metal oxide semiconductor field effect transistors (MOSFETs) to implement logic gates and switches. The composition of a PMOS transistor creates low resistance between its source and drain contacts when a low gate voltage is applied and high resistance when a high gate voltage is applied. On the other hand, the composition of an NMOS transistor creates high resistance between source and drain when a low gate voltage is applied and low resistance when a high gate voltage is applied. A CMOS logic inverter accomplishes current reduction by complementing every NMOS transistor with a PMOS transistor and connecting both gates and both drains together.

CMOS transmission gates, also known as CMOS analog switches (herein "CMOS switch(es") often form the interface between analog signals and digital controllers. The internal construction of a typical CMOS switch connects an NMOS in parallel with a PMOS to enable signals to pass in either direction with equal ease. The MOSFETs' sources are connected to each other and their drains are connected to each other. The terminals of the switched conduction path are the sources on one side and the drains on the other side. The switch is controlled by the gate-source voltage of the NMOS and PMOS devices. Whether the n- or p-channel device carries more signal current depends on the ratio of input to output voltage. Because the switch has no preferred direction for current flow, it has no preferred input or output. The typical CMOS switch can only be used if the terminal voltages are within the range of the supply rails.

CMOS switches, especially when used in power applications, often do not get the proper voltage values at their switch terminals to open and close correctly because they are often integrated on VLSI chips with dense digital and analog circuitry. A CMOS device requires control of the gate-to-source voltage to keep it within the maximum limits set by the process specifications which are typically much lower than the maximum limits for drain to source voltage. For example, a high-voltage CMOS switch device may have a drain-source voltage rating of 100 volts, but the maximum gate-source voltage may be only 5 volts. When the CMOS source voltage is not within the range of the supply voltage, some means must be provided to generate the gate voltage necessary to turn on the device. It is also necessary to hold the gate-source voltage to zero when the switch is in the off state. The standard practice in the art is to use charge pumps or level shifters that are used to provide the gate drive for CMOS switches in high voltage applications. The use of charge pumps, level shifters, or similar techniques typically do not provide gate voltage control independent of the polarity of the switch terminal voltages relative to each other and relative to the low voltage power supply rails.

CMOS devices are prone to a parasitic effect known as the parasitic diode of MOSFET, more commonly described as "the body diode", which causes an unwanted flow/direction of current over the body of the CMOS device, rather than the channel. The body diode is a consequence of the high volume CMOS design. The body diode occurs when a diode forms in the body, source and drain regions. When it is forward biased, it becomes an alternative path for current to flow and most of the current may pass to the body instead of through the channel. When reversed biased, it will develop capacitance due to the inherent nature of the diode. The formation of a parasitic diode (herein "body diode") can cause a latch-up or circuit failure.

Body diodes occur when using standard CMOS switches. The body diode of the PMOS device will conduct if the voltage on either the source or drain is greater than the positive supply voltage. Likewise, the body diode of the NMOS device will conduct if the voltage on either the source or Drain is less than the negative supply voltage. This is the reason why a standard CMOS switch can only be used if the source and drain terminal voltages are within the range of the supply rails. In a non-isolated CMOS process, the body of the NMOS device is connected to a common P-type silicon substrate. The source and drain of the NMOS are N-type implants on top of the P substrate. The body diodes are formed by the P-N junctions from body-to-drain and body-to-source. The body of the PMOS device is an N-well located on top of the common P-type substrate. In a non-isolated process without SOI and trench isolation, the P substrate is connected to the negative supply rail. Thus, the body of the NMOS device is always connected to the negative supply. The substrate underneath the N-well body of the PMOS device is the same substrate, connected to the negative supply. It is not possible to allow the voltage of the N-well body of the PMOS device to drop below the negative supply voltage without causing the substrate diode to conduct.

There are non-Silicon-On-Insulator processes that advertise isolated devices using a deep Nwell or N buried layer (NBL) that runs under the P-type body of the NMOS device and around the sides. In that case, the body of the NMOS device can be connected to a voltage other than the negative supply voltage, provided that the deep N-well is always biased with a voltage greater than or equal to the body voltage so as to avoid conduction through the P-N junction diode formed by the P body and deep N-well. The deep N-well also has to be biased at a voltage greater than or equal to the negative supply rail to avoid conduction through the diode formed by the P substrate and deep Nwell. The structure of the PMOS device is typically the same as in a non-isolated process. All of those parasitic paths place restrictions on the voltages that can be applied to the deep N and to the CMOS body, drain and source terminals. Hence, there is a need for a bidirectional integrated CMOS switch capable of switching voltages beyond the range of supply and ground potentials. Additionally, there is a need for a means to prevent conduction through the parasitic body diodes of the CMOS switch. The present invention enables switching high voltage loads operating at arbitrary or floating voltages relative to the low voltage power supply and ground, and provides on/off control of the switch with ordinary low voltage logic levels. The present invention can operate with high terminal voltages above and below the supply rails, which standard CMOS transmission gates cannot do. The present invention provides the proper gate voltages necessary to operate the switch, regardless of the switch terminal voltages. The present invention provides bidirectional switching without conducting through the parasitic body diodes of the CMOS devices. The present invention can be integrated on the same CMOS chip as other circuitry, eliminating the need for separate TRIAC switches, optocouplers, or other external devices. No charge pumps or high voltage supplies are needed. The present invention provides cost efficiencies because of its efficient integration with other components and its lower failure rate.

DETAILED DESCRIPTION OF THE PRIOR ART

Switches currently exist in the art that are designed to operate beyond the supply rail voltages. One such device is the MAX14777—Quad-Beyond-the-Rails −15V to +35V Analog Switch, offered by Maxim Integrated Products Inc. This device is distinguished from the present invention because the Maxim device uses charge pumps to develop a secondary set of high voltage positive and negative supply rails to accomplish the switching above and below the rails. The specification for the MAX14777, available at http://datasheets.maximintegrated.com/en/ds/MAX14777.pdf discloses that the device contains a total of three charge pumps to generate bias voltages for the internal switches. Conversely, the present invention eliminates the need to use charge pumps.

U.S. Pat. No. 8,461,905 discloses an adaptive bootstrap circuit for controlling CMOS switches. It is distinguished from the present invention as it (a) does not prevent conduction through the parasitic body diodes of the CMOS device; (b) does not accommodate switch drain and source voltages beyond the range of the supply rails in the ON state; and (c) is primarily designed to provide an off-state gate voltage on the CMOS devices that is above or below the supply voltages by an amount equal to the saturation voltage of a CMOS device.

U.S. Pat. No. 7,760,007 discloses a low voltage analog CMOS switch. The circuitry described is designed to control the well voltage of the PMOS device to enable the switch to conduct properly for low voltages. It is distinguished from the present invention as it does not disclose that it can accommodate switch terminal voltages beyond the range of the supply voltages.

Application 2013/0194158 discloses a radio frequency switch for a transmitter/receiver IO port with electrostatic discharge protection. It is distinguished from the present invention as it does not disclose that the switch can operate at terminal voltages that extend beyond the supply rails.

Therefore, within the present invention is disclosed an apparatus and method for a bidirectional integrated CMOS switch that is novel in the art.

OBJECTS OF THE INVENTION

Accordingly, an object of the present invention is to provide a bidirectional integrated CMOS switch capable of switching voltages beyond the range of the supply and ground potentials.

Another object of the present invention is to provide a bidirectional integrated CMOS switch that can switch high voltage loads operating at arbitrary or floating voltages relative to the low voltage power supply and ground.

Another object of the present invention is to provide a bidirectional integrated CMOS switch that can enable on/off control of the switch with ordinary low voltage levels.

Another object of the present invention is to provide a bidirectional integrated CMOS switch that can operate with high terminal voltages above and below the supply rails.

Another object of the present invention is to provide a bidirectional integrated CMOS switch that can provide the proper gate voltages necessary to operate the switch, regardless of the magnitude or polarity of the switch terminal voltages.

Another object of the present invention is to provide a bidirectional integrated CMOS switch that can provide bidirectional switching without conducting through the parasitic body diode of the CMOS device.

Another object of the present invention is to provide a bidirectional integrated CMOS switch that can be integrated on the same CMOS chip as other circuitry, eliminating the need for separate TRIAC switches, optocouplers, or other external devices.

Another object of the present invention is to provide a bidirectional integrated CMOS switch that eliminates the need for charge pumps or high voltage supplies.

Another object of the present invention is to provide a bidirectional integrated CMOS switch that is more cost effective and less prone to failure than what is currently available in the industry.

SUMMARY OF THE INVENTION

The present invention combines three functional elements: (1) a NMOS/PMOS pair as the switched conduction path; (2) a diode bridge; and (3) control circuitry to turn the switch on and off using standard 5 v logic (or other low voltage supplies that are compatible with the gate source voltages needed to turn on the NMOS/PMOS pair), regardless of the voltages on the switch terminals. The present invention makes use of a high voltage Silicon-on-Insulator (herein "SOI") manufacturing process with deep trench isolation, which provides circuit elements that are isolated from one another on the same silicon chip. The SOI process provides the capability to create circuitry using diodes and MOSFETS that reside in separate wells isolated from each other by non-conductive material, without parasitic substrate structures. An SOI process with deep trench has non-conductive material under the bodies of the CMOS devices and around the sides, so there are no diode connections to the P-substrate and there is no buried N layer underneath the P body of the NMOS. Except for the source-body and drain-body diodes, all of the other parasitic diodes are eliminated. The diodes in the bridge are also isolated in individual wells, so there are no parasitic structures associated with them. The SOI process assures that the diodes and MOSFETs reside in separate wells isolated from each other by non-conductive material, without parasitic substrate structures. The present invention will also operate if a different process is used that can provide similar isolation capability.

The diode bridge allows current to flow in either direction between the two terminals of the switch without forward-biasing the parasitic body diodes of the CMOS switching elements.

The control circuit is configured such that the gate-source voltages of the isolated CMOS devices can be controlled regardless of the voltages applied to the switch terminals. The only limitation on the terminal voltages is the maximum operating condition imposed by the process technology, which can be greater than +/−100V for some processes.

A novelty of the present invention is the circuit configuration that enables CMOS circuit elements to switch any load within the limits of the process technology using ordinary low-voltage logic inputs as control, without use of optocouplers, TRIACs, or other such components that are not typically available in a CMOS process. This makes it possible to integrate the switch on a chip with other analog and digital circuitry, thus eliminating the external switching components that are typically used in power switching applications, such as motor controls. The present invention eliminates the need for charge pumps, booster circuits and level shifters that are often used to provide the gate drive for CMOS switches in high voltage applications, and instead provides gate voltage control independent of the magnitude or polarity of the switch terminal voltages relative to each other and relative to the low voltage power supply rails.

In the present invention, the bodies of the PMOS and NMOS devices are connected to their respective source nodes instead of the supply rails. Since there are no parasitic diodes to the substrate, the body connections can be to any voltage that does not cause the body diodes to become forward biased. For each device, the source is connected to the body so that the body voltage is equal to the source voltage and the source-body diode cannot conduct. The diode bridge guarantees that current can only flow in a direction opposite to the direction that would turn on the drain-body diodes. Hence, the only possible conduction path is through the CMOS device channel when it is turned on by applying the proper gate voltage. When the gate is biased so as to turn off the channel, there are no conduction paths through the switch. There is only a small amount of current to the source nodes due to the control network structures connected across the gate-to-source of each of the two CMOS switch devices.

DETAILED DESCRIPTION OF THE PREFERRED EMBODIMENT

Figure 1:
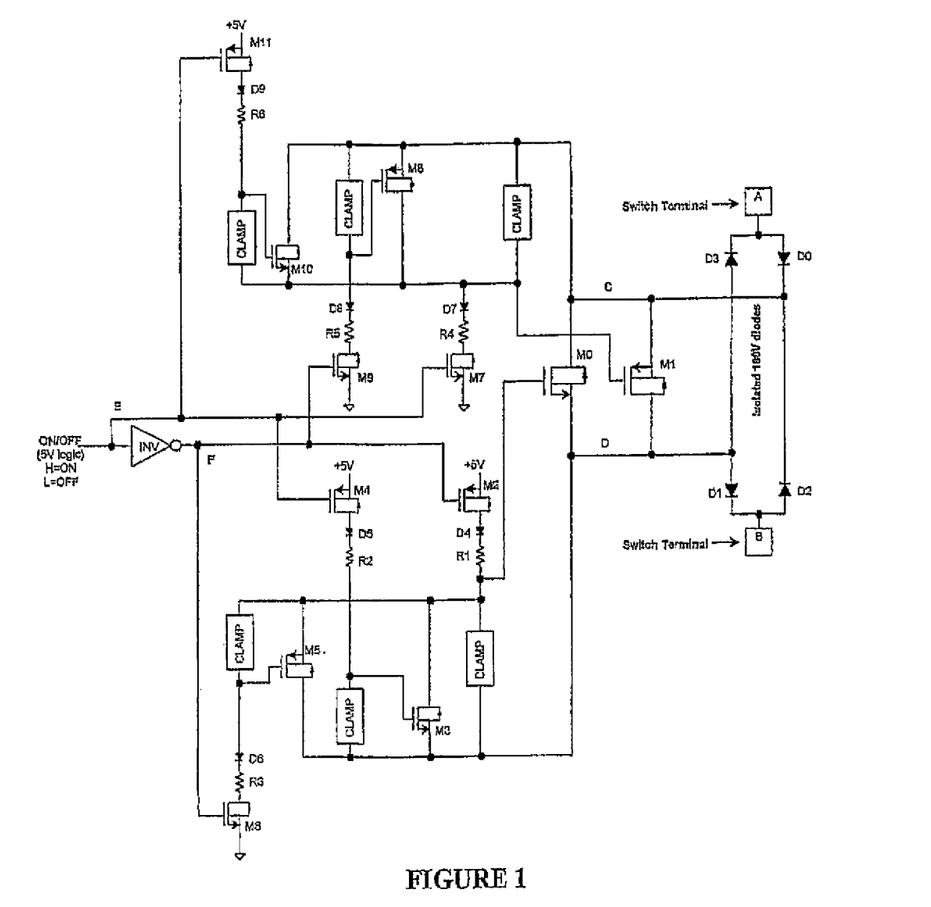
FIG. 1 is a schematic of the invention's preferred embodiment.

FIG. 1 illustrates an embodiment of the invention. All of the elements in the diagram are high voltage isolated devices. Terminals A and B are the switch terminals. The voltages at Terminals A and B may be any value, positive or negative, within the limits of the process technology. Diodes D0, D1, D2 and D3 form a diode bridge which causes current to flow through the switch in only one direction, from Node C to Node D, regardless of the polarity of the voltages on terminals A and B. M0 and M1 are high voltage NMOS and PMOS transistors configured as a transmission gate, with parasitic body diodes oriented in the same direction, opposing the direction of current flow through the switch. The diode bridge, M0 and M1 form the conduction path for current through the switch. Due to the diode bridge, the voltage at node C is always greater than or equal to the voltage at node D. Consequently, the body diodes of M0 and M1 are never forward biased.

PMOS device M2, diode D4, resistor R1 and the clamp connected from gate to source across NMOS device M0 form the primary ON/OFF control for M0. When the gate of M2 is pulled low, M2 is turned on and the current flows through M2, D4, and R1 to pull up the gate of M0. The CLAMP limits the gate-to-source voltage of M0, protecting it from excessive voltage, even when the source voltage at node D is a large negative value. Resistor R1 limits the current to a low value to minimize bias current flow to node D. In an alternative embodiment, a switched current source may be used to limit current. Diode D4 prevents current flow to the 5V supply when the voltage at node D is greater than 5V.

When the gate of M2 is pulled high, M2 is turned off. The gate-source voltage of M0 is discharged through the CLAMP and the gate-source voltage of M0 drops to zero, turning M0 off. In the off state, devices M3 and M5 are turned on to hold the gate-source voltage of M0 at zero, to prevent it from being turned on by charge that may be capacitively coupled to the gate from transients on the drain and source nodes.

Device M0 can be turned on when the voltage at node D is far enough below the +5V supply rail to develop a forward bias on D4 and sufficient gate-source voltage is present on M0 to turn it on. In normal operation, M0 can be turned on whenever the voltage at node D is approximately +3.5V or less. Since the diode bridge causes the voltage at node C to be greater than or equal to the voltage at node D, turning on M0 will always form a conduction path through the switch under these conditions. When the voltage at node D is too high to turn on M0, the conduction path will be through M1.

NMOS device M7, diode D7, resistor R4 and the CLAMP connected from gate to source across PMOS device M1 form the primary ON/OFF control for M1. When the gate of M7 is pulled high, M7 is turned on and current flows through M7, D7 and R4 to pull down the gate of M1. The CLAMP limits the gate-to-source voltage of M1, protecting it from excessive voltage, even when the source voltage at node C is a large positive value. Resistor R4 limits the current to a low value to minimize bias current flow to node C. In an alternative embodiment, a switched current source may be used to limit current. Diode D7 prevents current flow to ground when the voltage at node C is negative.

When the gate of M7 is pulled low, M7 is turned off. The gate-source-voltage of M1 is discharged through the CLAMP and the gate-source-voltage of M1 drops to zero, turning M1 off. In the off state, devices M8 and M10 are turned on to hold the gate-source voltage of M1 at zero, to prevent M1 from being turned on by charge that may be coupled to the gate from transients on the drain and source nodes through parasitic capacitance.

Device M1 can be turned on when the voltage at node C is far enough above ground to develop a forward bias on D7 and sufficient gate-source voltage exists on M1 so that M1 can be turned on. In normal operation, M1 can be turned on whenever the voltage at node C is approximately +1.5V or greater. Since the diode bridge causes the voltage at node C to be greater than or equal to the voltage at node D, turning on M1 will always form a conduction path through the switch under these conditions.

For voltages between approximately +1.5V and +3.5V there is an overlap in the conduction conditions for M0 and M1 and both devices can be turned on. Together, devices M0 and M1 provide on-state conduction across a large range of voltages on nodes C and D, from large negative to large positive values, limited only by the maximum drain-source voltage ratings of the devices. To conduct current through the switch, the absolute value of the voltage difference between terminals A and B must be sufficient to forward-bias the diodes in the diode bridge. All PMOS and NMOS devices are isolated with the body connections shorted to the source voltages. All of the CLAMP elements in FIG. 1 are used to limit gate-source voltages and to provide a discharge path for gate charge when the associated bias sources are turned off. A variety of well-known techniques may be used to construct the CLAMP elements, such as circuits using series diodes, zener diodes, MOSFETs, resistors, or other devices available in the process technology. All of the resistors are large value resistors for the purpose of limiting current. In other embodiments of the present invention, any or all of the resistors may be replaced by switched current sources.

The inverter (INV) shown in FIG. 1 may be replaced by a different function such as controlling the NMOS and PMOS gates by a function other than direct inversion or to provide independent control of the NMOS and PMOS gates. In this embodiment nodes E and F could be interchanged so that F is connected to the inverter input and E is connected to the inverter output. That would invert the input logic signal function such that H=OFF and L=ON.

Example 1 (FIG. 2) shows a circuit for connecting a load to a floating high voltage source of arbitrary polarity. There is a low voltage on/off control logic. The low voltage may be about 5 volts. The switch of FIG. 1 with the A and B terminals are connected to the floating high voltage sources of arbitrary polarity and a load as shown in FIG. 2.

Figure 2:
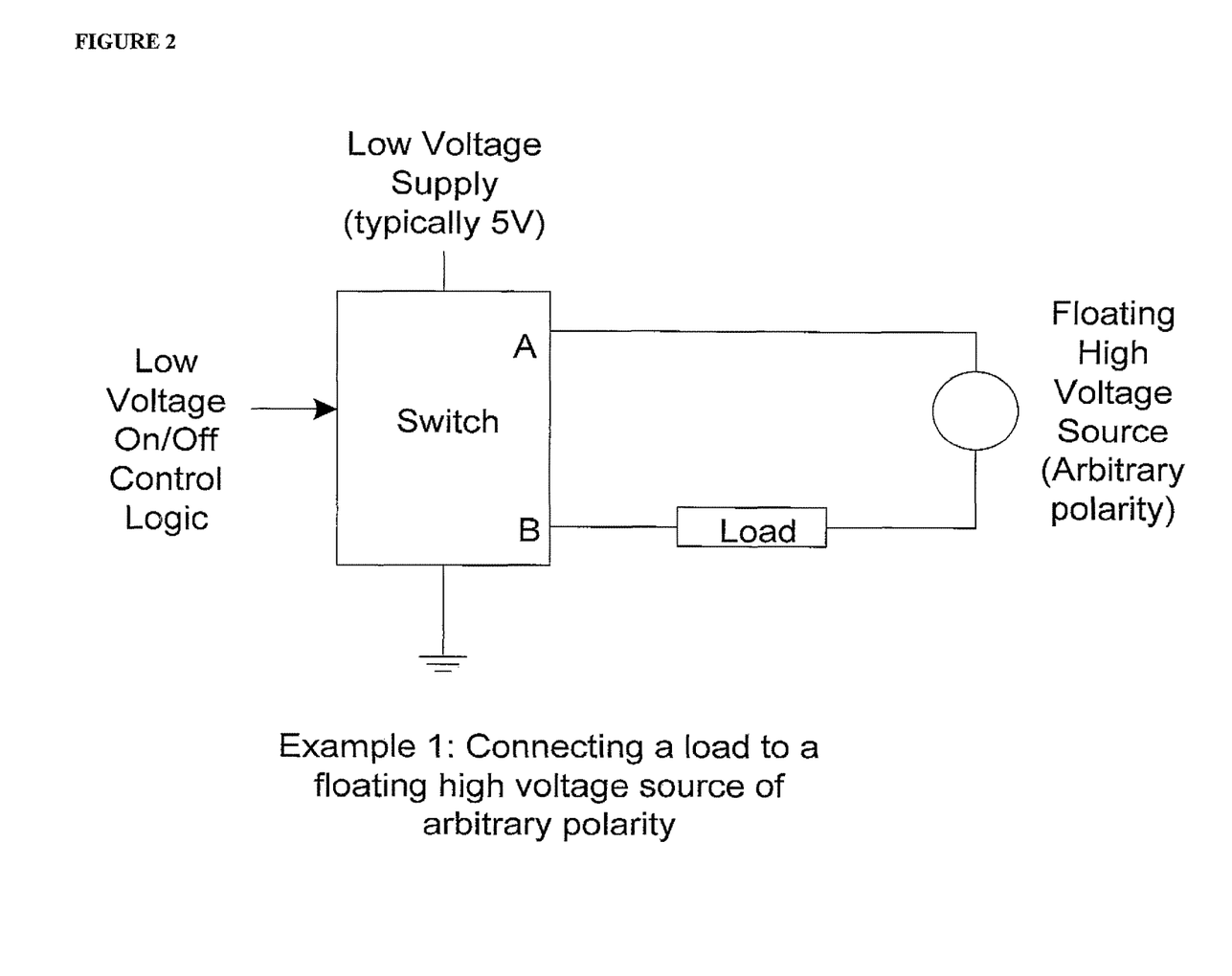
FIG. 2 shows the use of the invention connecting a load to a floating high voltage source of arbitrary polarity.
Figure 3:
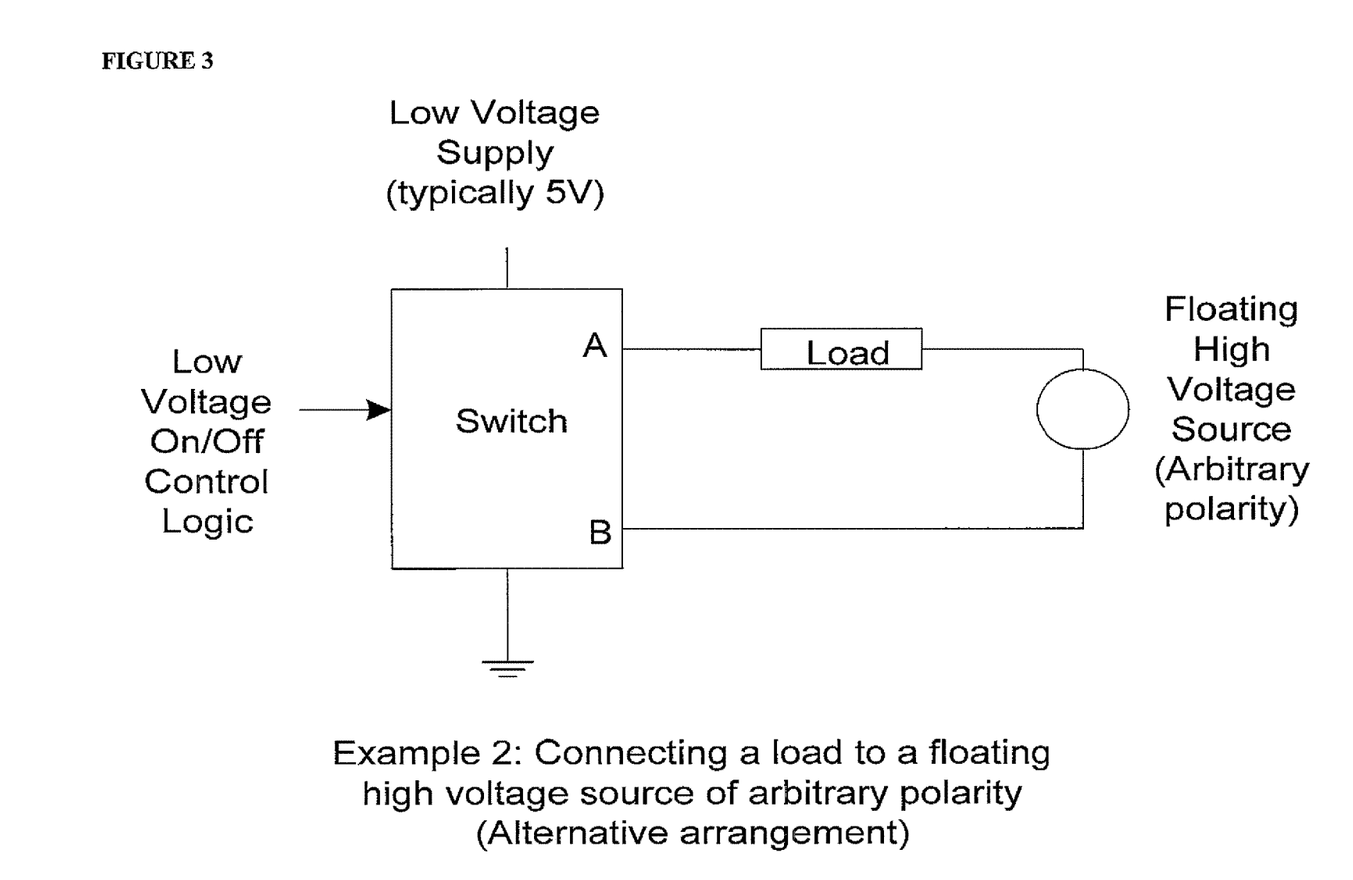
FIG. 3 shows an alternate embodiment of the use of the invention connecting a load to a floating high voltage source of arbitrary polarity.

Example 2 (FIG. 3) is similar to FIG. 2 except as to the location of the load. In FIG. 2 the load is between switch B and the floating high voltage source of arbitrary polarity, while in FIG. 3 it is between switch A and the floating high voltage source of arbitrary polarity.

Figure 4:
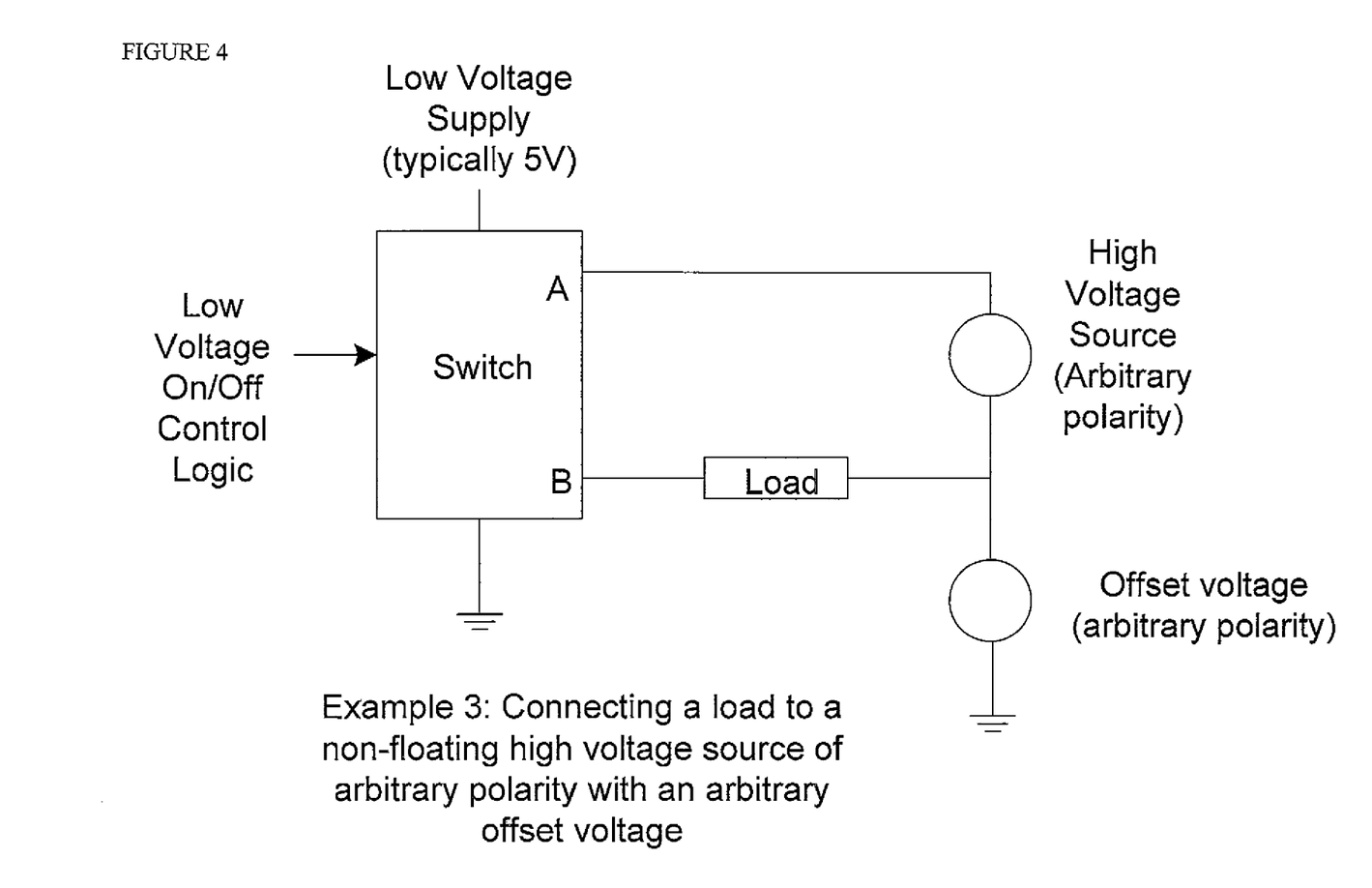
FIG. 4 shows the use of the invention connecting a load to a non-floating high voltage source of arbitrary polarity with an arbitrary offset voltage.

In Example 3 (FIG. 4) the load is connected to a non-floating, high voltage source of arbitrary polarity with an arbitrary offset voltage. As in FIGS. 2 and 3 there is a low voltage on/off control logic connected to the circuit of FIG. 1. There is a low voltage supply typically about 5 volts. The load is between switch B and both the high voltage source of arbitrary polarity and an offset voltage of arbitrary polarity.

Figure 5:
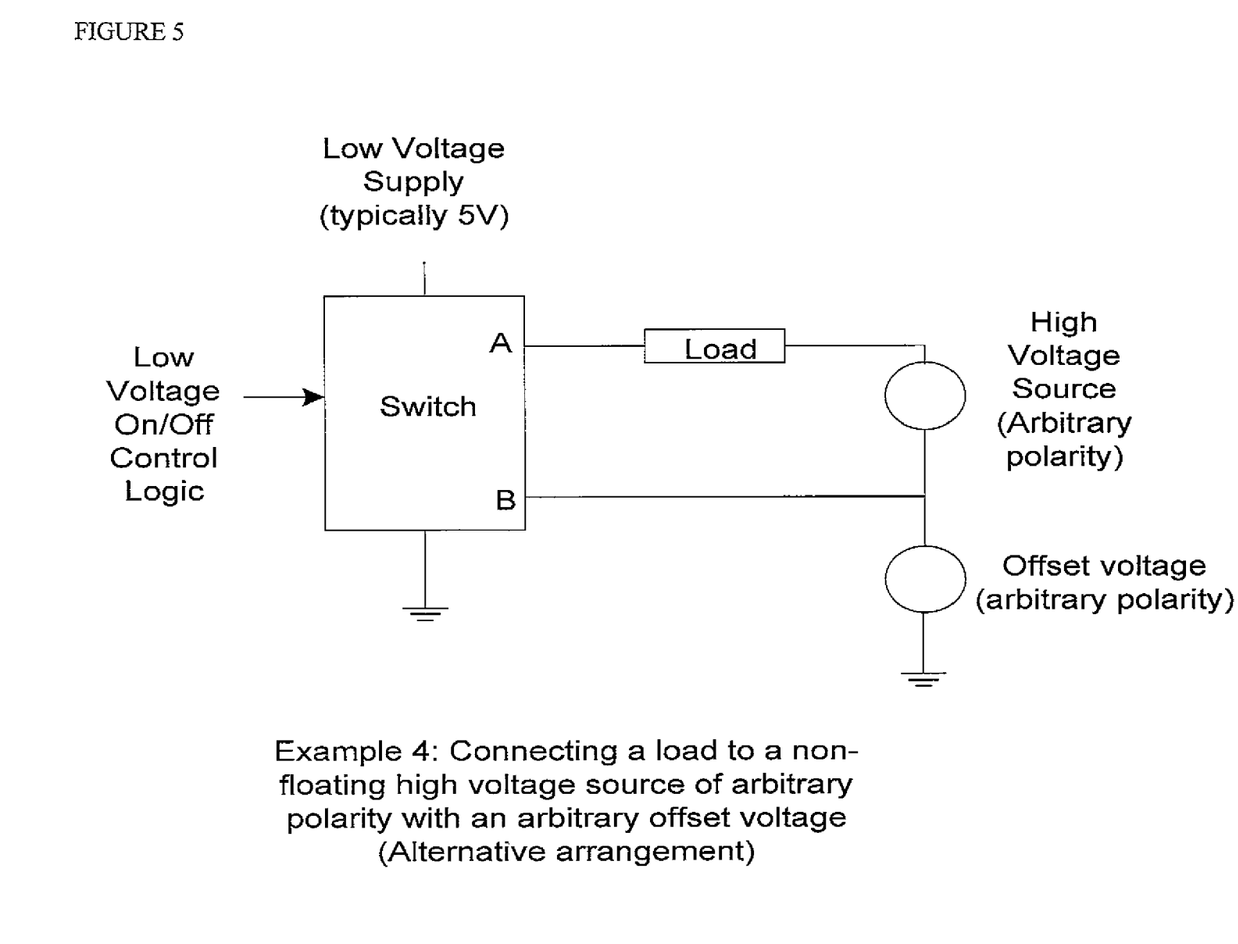
FIG. 5 shows an alternate embodiment of use of the invention connecting a load to a non-floating high voltage source of arbitrary polarity with an arbitrary offset voltage.

In Example 4 (FIG. 5) the load is between the switch A and the high voltage source of arbitrary polarity.

Figure 6:
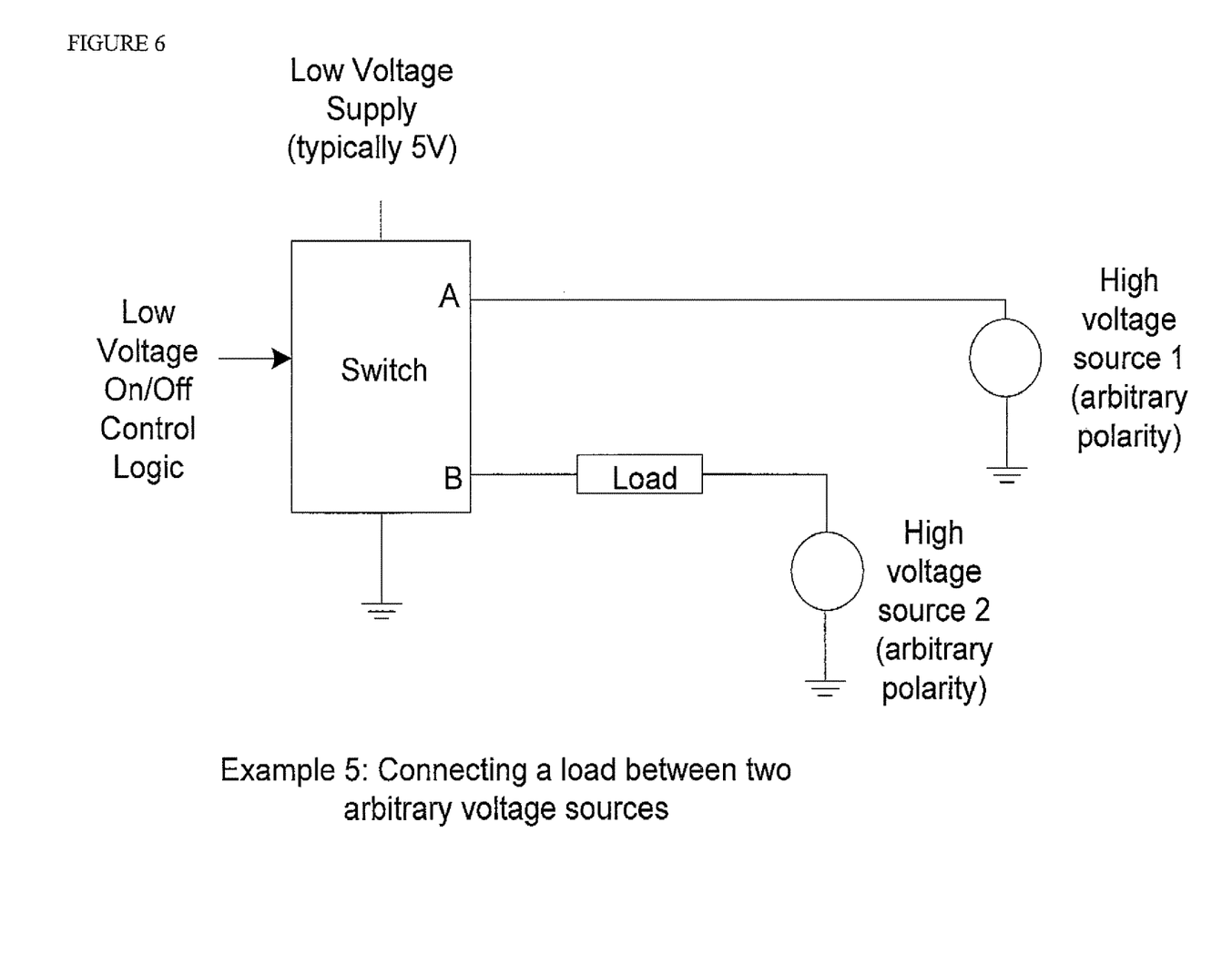
FIG. 6 shows the use of the invention connecting a load between two arbitrary voltage sources.

FIG. 6, Example 5, of the present invention has switch A connected to a first high voltage source of arbitrary polarity. The load is connected to switch B and a second source of high voltage of arbitrary polarity.

Figure 7:
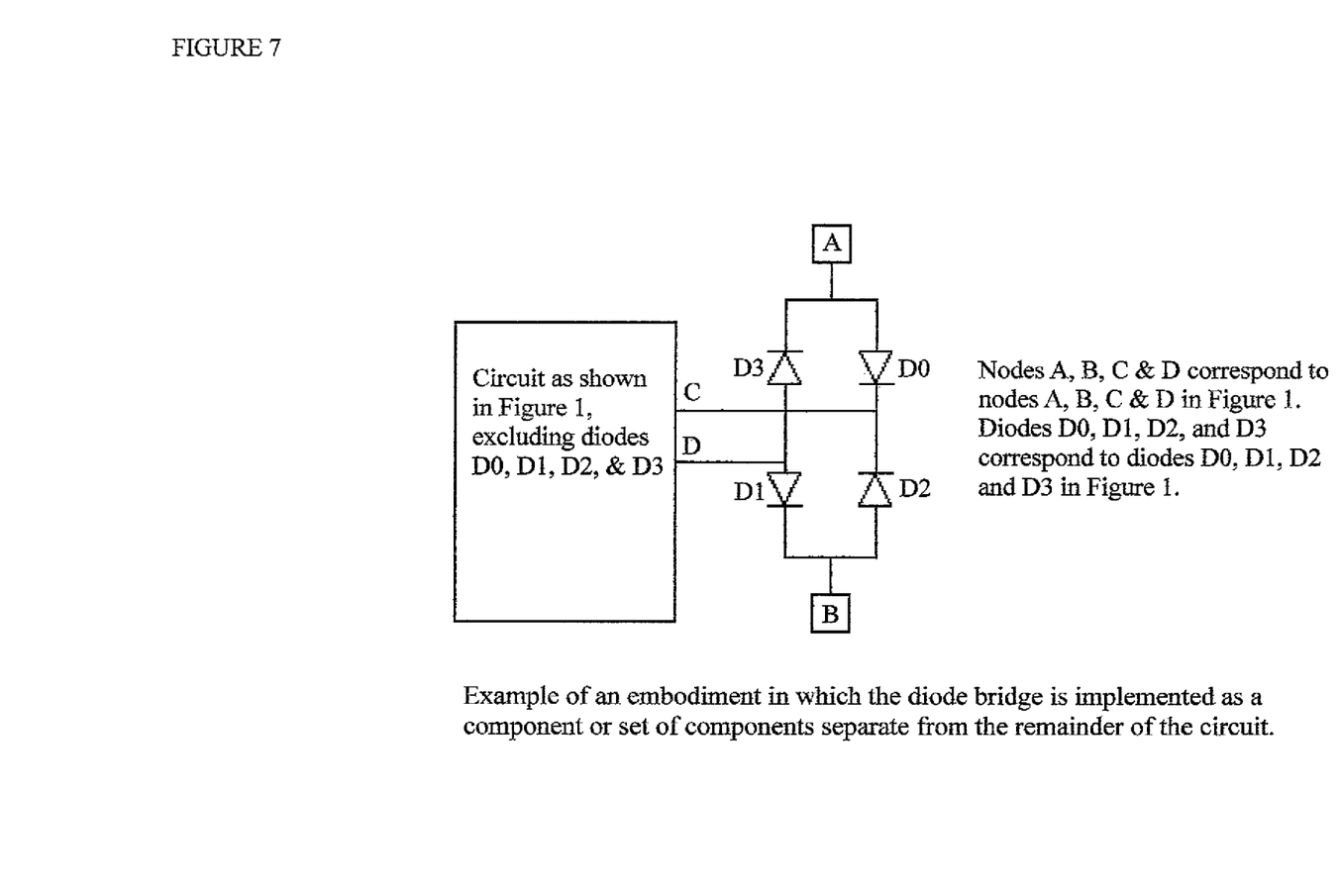
FIG. 7 shows an example of an alternative embodiment where the diode bridge is implemented as one component or a set of components separate from the rest of the components of the circuit.

FIG. 7 shows an alternate embodiment of the present invention where the diode bridge is separate from the remainder of the CMOS circuit. In this example the diode bridge is implemented as a separate component or set of components from the remainder of the circuit. In this example nodes A, B, C and D correspond to nodes A, B, C & D in FIG. 1. Diodes D0, D1, D2 and D3 correspond to diodes D0, D1, D2 and D3 in FIG. 1.

Figure 8:
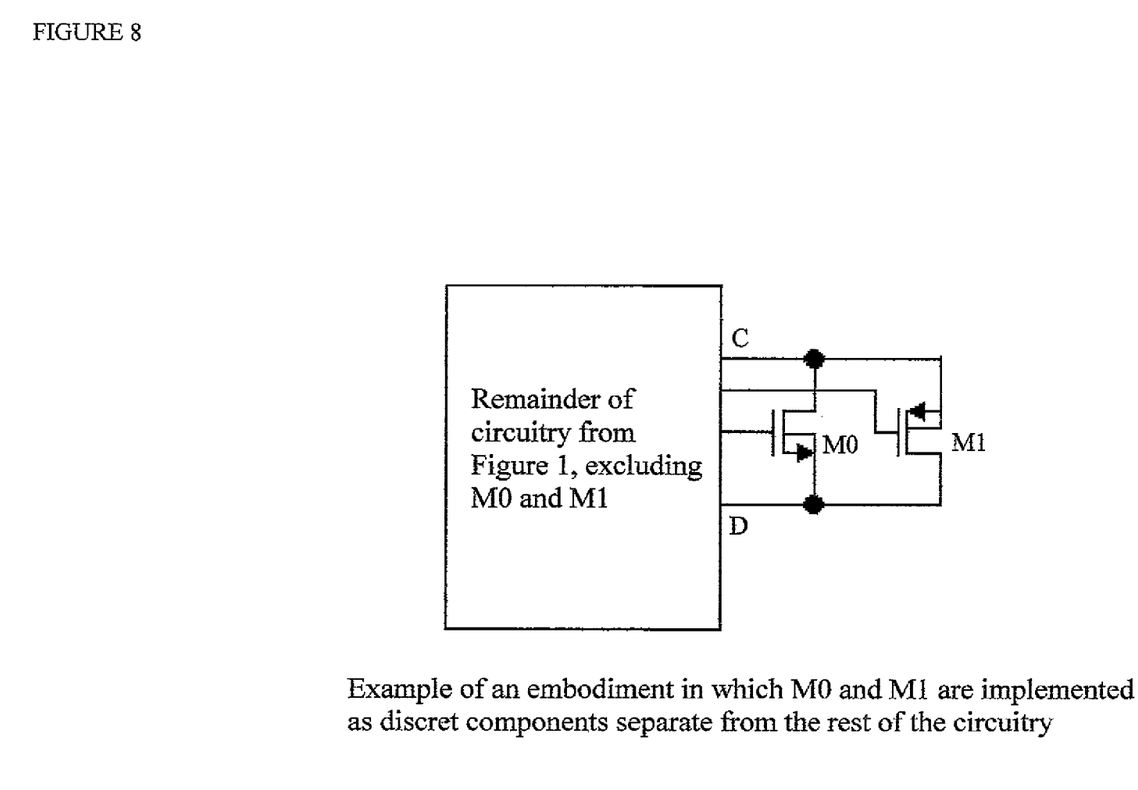
FIG. 8 shows an example of an alternative embodiment in which the CMOS switch elements corresponding to M0 or M1 are external to the integrated circuit.

FIG. 8 is an example of an embodiment in which M0 and M1 are implemented as discrete components separate from the rest of the circuitry.

Figure 9:
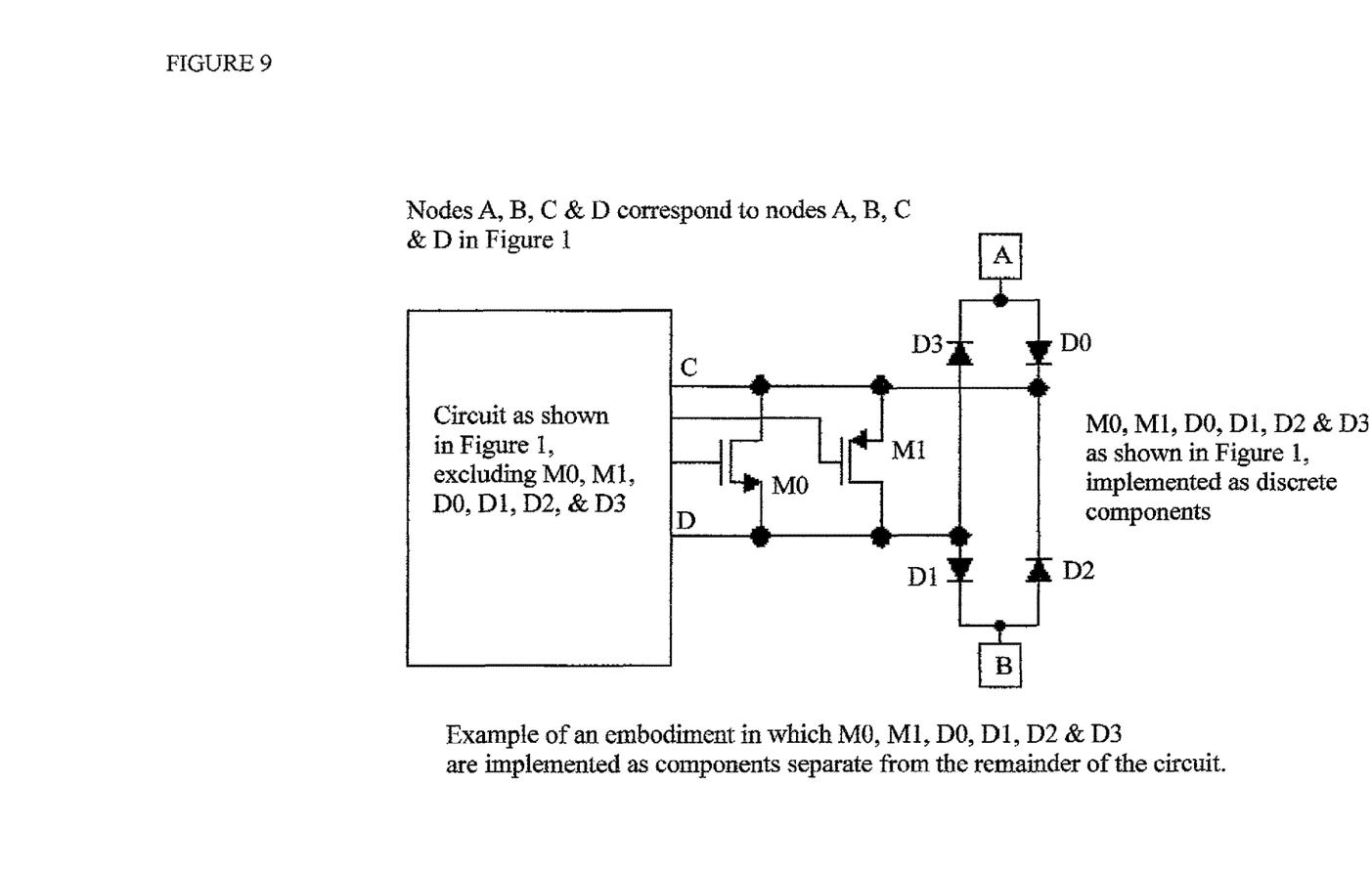
FIG. 9 shows an alternative embodiment in which M0, M1, D0, D1, D2 and D3 are implemented as components separate from the remainder of the circuit.

An example of an embodiment in which M0, M1, D0, D1, D2 and D3 are implemented as components separate from the remainder of the circuit is shown in FIG. 9. Nodes A, B, C and D correspond to nodes A, B, C and D in FIG. 1. M0, M1, D0, D1, D2 and D3 correspond to devices M0, M1, D0, D1, D2 and D3 as shown in FIG. 1, implemented as discrete components.

Figure 10:
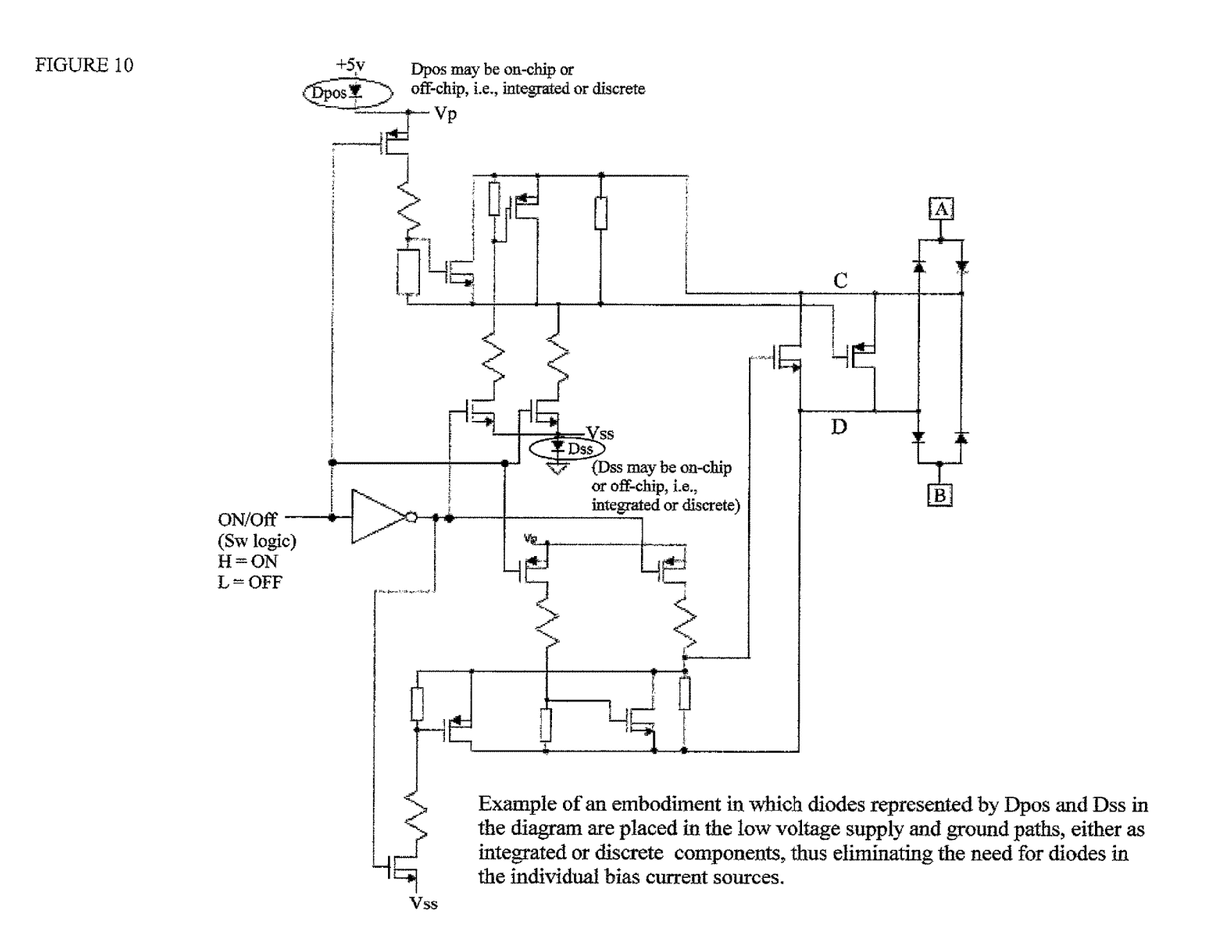
FIG. 10 shows a further alternative embodiment in which diodes are placed in the low voltage supply and ground paths.

FIG. 10 is an example where the diodes have been removed from the bias current sources and instead placed in series with the 5V and ground supply connections, either as integrated components on the chip or as external discrete components. In applications using a fabrication process that doesn't provide on-chip diodes, this approach could be used in combination with a separate off-chip diode bridge. Since the purpose of the diodes in the bias current paths is to prevent reverse current to the supply terminals, the result is the same whether they are at the supply inputs or in the bias current sources. Likewise, it is possible to move any of the circuit elements off-chip and substitute external discrete components, as long as they are properly connected to the chip. This also applies to the embodiment shown in FIG. 9 above.

In addition, FIG. 10 is an example of an embodiment in which diodes represented by Dpos and Dss in the diagram are placed in the low voltage supply and ground paths, either as integrated or discrete components, thus eliminating the need for diodes in the individual bias current sources. In this embodiment the Dpos may be on-chip or off-chip, i.e. integrated or discrete. Similarly, Dss may also be on-chip or off-chip, i.e. integrated or discrete.

Figure 11:
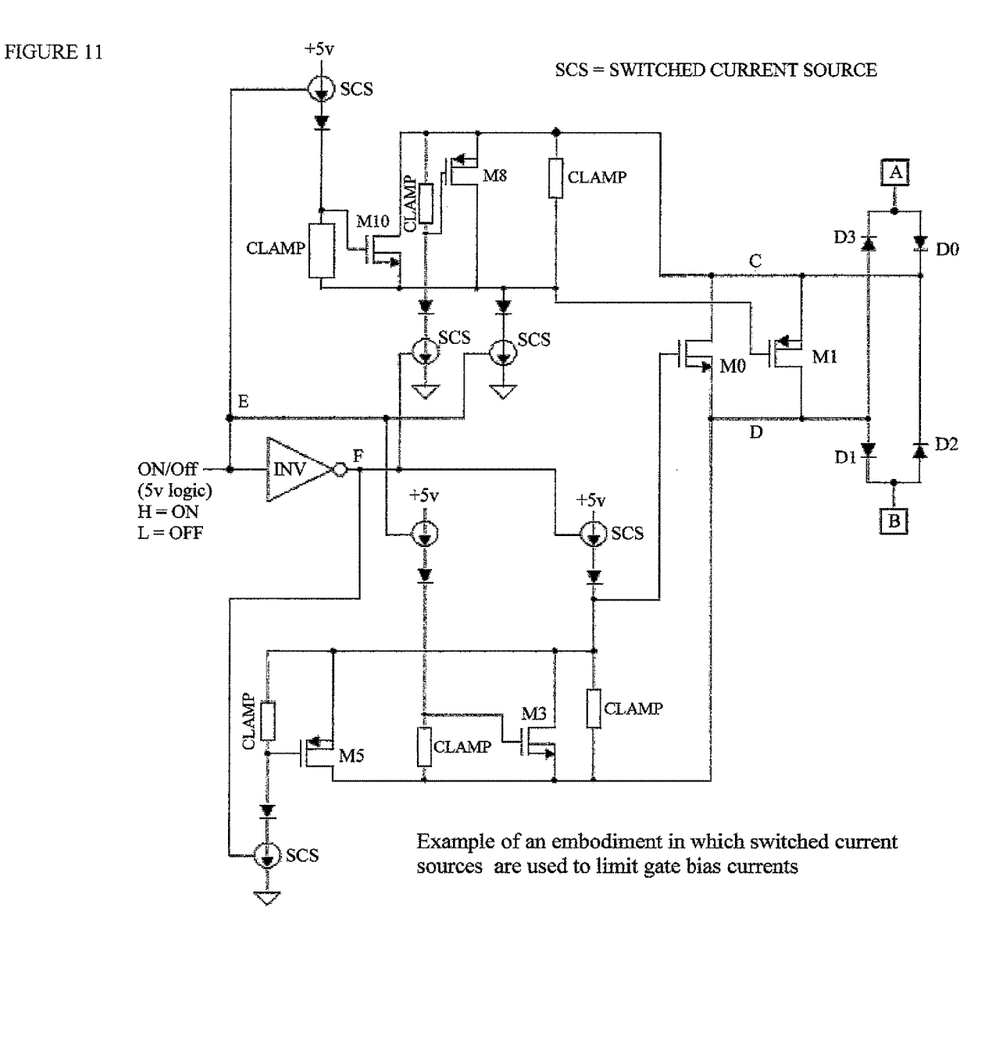
FIG. 11 shows a still further embodiment in which switched current sources are used to limit gate bias currents.

FIG. 11 is an example of an embodiment in which switched current sources are used to limit gate bias currents. In FIG. 11 the gate control currents may be limited by means other than resistors, such as current mirrors or other types of limited current sources. The gate control currents may be supplied by switched current sources without the need for current limiting resistors in these embodiments.

Although 5 volts is shown in the figures, one skilled in the art will appreciate that there can be embodiments in which the gate control operates with a supply voltage other than 5 volts. There is standard logic that uses 3.3 volts, for example, or a less common logic supply voltage may be used. The supply voltage does not matter, as long as the proper bias voltages can be generated to turn the switch on and off. The present invention may also include embodiments where the nodes shown as ground and +5V are connected to voltages other than ground and +5V, as long as the voltage difference between the supply rails is of sufficient magnitude and polarity to control the switch. Provided the connected input logic levels are consistent with the applied supply voltages, the circuit would remain unchanged. The ground terminal does not necessarily have to be connected to zero volts. It is the difference between ground and the supply rail that matters.

In another embodiment one or more of the CMOS elements are replaced by bipolar transistors or other types of switching elements, such as opto-couplers, DMOS, JFETS, relays, etc.

What has been described is a novel bidirectional integrated CMOS switch capable of switching voltages beyond the range of supply and ground potentials. The application and embodiments described herein are given as an examples of the useful nature of the invention and are not intended to limit the scope of the invention.

What is claimed is:

1. A bidirectional integrated CMOS switch comprising:
    a diode bridge comprising a first diode (D0), a second diode (D1), a third diode (D2), and a fourth diode (D3);
    a first switch terminal (A) coupled to said diode bridge between said fourth diode (D3) and said first diode (D0);
    a second switch terminal (B) coupled to said diode bridge between said second diode (D1) and said third diode (D2);
    a first NMOS transistor (M0), and a first PMOS transistor (M1), configured as a transmission gate, with each said transistor comprising a parasitic body diode oriented in the same direction, wherein a source of said first PMOS transistor (M1) and a drain of said first NMOS transistor (M0) are each respectively coupled to said diode bridge between said first diode (D0) and said third diode (D2) to form a first node (C), and wherein a drain or said first PMOS transistor (M1) and a source of said first NMOS transistor (M0) are each respectively coupled to said diode bridge between said second diode (D1) and said fourth diode (D3) to form a second node (D);
    wherein said diode bridge, said first NMOS transistor (M0), and said first PMOS transistor (M1) are coupled to form a conduction path to cause current to flow from either of said first and second switch terminals (A/B) through said switch in only one direction, from said first node (C) to said second node (D), regardless of a voltage polarity on said first and second switch terminals (A/B), to prevent said body diodes from being forward biased;
    a logic inverter;
    a first clamp coupled across a gate and a source of said first NMOS transistor (M0) to limit gate-to-source voltage of said first NMOS transistor (M0);
    a second PMOS transistor (M2), a fifth diode (D4), and a first resistor (R1) connected from said gate of said first NMOS transistor (M0) to said logic inverter, to form a primary on/off control for said first NMOS transistor (M0); wherein when a gate of said second PMOS transistor (M2) is pulled low, said second PMOS transistor (M2) is turned on and current flows through said second PMOS transistor (M2), said fifth diode (D4), and said first resistor (R1), to pull up said gate of said first NMOS transistor (M0); wherein said first resistor (R1) is configured to minimize bias current flow to said second node (D); and wherein when said gate of said second PMOS transistor (M2) is pulled high, said second PMOS transistor (M2) is turned off, and gate-source voltage of said first NMOS transistor (M0) is discharged through said first clamp, and drops to zero, to turn off said first NMOS transistor (M0);
    a second clamp coupled across a gate and a source of said first PMOS transistor (M1) to limit gate-to-source voltage of said first PMOS transistor (M1); and
    a second NMOS transistor (M7), a sixth diode (D7), and a second resistor (R4) connected from said gate of said first PMOS transistor (M1) to said logic inverter, to form a primary on/off control for said first PMOS transistor (M1); wherein when a gate of said second NMOS transistor (M7) is pulled high, said second NMOS transistor (M7) is turned on and current flows through said second NMOS transistor (M7), said sixth diode (D7), and said second resistor (R4), to pull down said gate of said first PMOS transistor (M1); wherein said second resistor (R4) is configured to minimize bias current flow to said first node (C); and wherein when said gate of said second NMOS transistor (M7) is pulled low, said second NMOS transistor (M7) is turned off, and gate-source voltage of said first PMOS transistor (M1) is discharged through said second clamp, and drops to zero, to turn off said first PMOS transistor (M1).

2. The switch according to claim 1 wherein said switch is formed with a high voltage silicon-on-insulator manufacturing process with deep trench isolation, with each of said diodes of said bridge isolated in individual wells, with a non-conductive material under and around each side of a body of each said diode; with each of said NMOS and PMOS transistors isolated in individual wells with a non-conductive material under and around each side of a body of each of said NMOS transistors and a body of each of said PMOS transistors, and with each of said plurality of control circuitry elements isolated in individual wells with a non-conductive material under and around each side of a body of each of said control circuitry elements.

3. A bidirectional integrated CMOS switch comprising:
    a diode bridge comprising a first diode (D0), a second diode (D1), a third diode (D2), and a fourth diode (D3) connected to allow current to flow only by way of a transmission gate;
    a first switch terminal (A) coupled to said diode bridge between said fourth diode (D3) cathode and said first diode (D0) anode;
    a second switch terminal (B) coupled to said diode bridge between said second diode (D1) cathode and said third diode (D2) anode;
    a first NMOS transistor (M0), and a first PMOS transistor (M1), configured as the transmission gate, with each said transistor comprising a parasitic body diode oriented in the same direction, wherein a source of said first PMOS transistor (M1) and a drain of said first NMOS transistor (M0) are each respectively coupled to said diode bridge between said first diode (D0) cathode and said third diode (D2) cathode to form a first node (C), and wherein a drain of said first PMOS transistor (M1) and a source of said first NMOS transistor (M0) are each respectively coupled to said diode bridge between said second diode (D1) anode and said fourth diode (D3) anode to form a second node (D);
    wherein said diode bridge, said first NMOS transistor (M0), and said first PMOS transistor (M1) are coupled to form a conduction path to cause current to flow from either of said first and second switch terminals (A/B) through said transmission gate, between said first node (C) to said second node (D), regardless of a voltage polarity on said first and second switch terminals (A/B), to prevent said body diodes from being forward biased;
    a plurality of control circuitry elements comprising:
        a logic level voltage input directly to a first group of control circuit transistors;
        a logic inverter providing an inverted logic voltage to a second group of control circuit transistors;
        a first clamp, said first clamp coupled across a gate and a source of said first NMOS transistor (M0) to limit gate-to-source voltage of said first NMOS transistor (M0);
        a second PMOS transistor (M2), a fifth diode (D4), and a first resistor (R1) connected from said gate of said first NMOS transistor (M0) to said logic inverter, to form a primary on/off control for said first NMOS transistor (M0); wherein when a gate at said second PMOS transistor (M2) is pulled low, said second PMOS transistor (M2) is turned on and current flows through said second PMOS transistor (M2), said fifth diode (D4), and said first resistor (R1), to pull up said gate of said first NMOS transistor (M0); wherein said first resistor (R1) is configured to minimize bias current flow to said second node (D); and wherein when said gate of said second PMOS transistor (M2) is pulled high, said second PMOS transistor (M2) is turned off, and gate-source voltage of said first NMOS transistor (M0) is discharged through said first clamp, and drops to zero, to turn off said first NMOS transistor (M0);

a second clamp, said second clamp coupled across a gate and a source of said first PMOS transistor (M1) to limit gate-to-source voltage of said first PMOS transistor (M1);

a second NMOS transistor (M7), a sixth diode (D7), and a second resistor (R4) connected from said gate of said first PMOS transistor (M1) to said logic inverter, to form a primary on/off control for said first PMOS transistor (M1); wherein when a gate of said second NMOS transistor (M7) is pulled high, said second NMOS transistor (M7) is turned on and current flows through said second NMOS transistor (M7), said sixth diode (D7), and said second resistor (R4), to pull down said gate of said first PMOS transistor (M1); wherein said second resistor (R4) is configured to minimize bias current flow to said first node (C); and wherein when said gate of said second NMOS transistor (M7) is pulled low, said second NMOS transistor (M7) is turned off, and gate-source voltage of said first PMOS transistor (M1) is discharged through said second clamp, and drops to zero, to turn off said first PMOS transistor (M1); and wherein said plurality of control circuitry elements, resistors, diodes and clamps are configured to support turning said transmission gate on and off using low voltage supplies and logical level inputs that taken together form said switch.

* * * * *